United States Patent [19]

Sasaki

[11] Patent Number: 4,754,232
[45] Date of Patent: Jun. 28, 1988

[54] AMPLIFICATION GAIN ADJUSTING CIRCUIT

[75] Inventor: Yoshio Sasaki, Saitama, Japan

[73] Assignee: Pioneer Electronic Corporation, Tokyo, Japan

[21] Appl. No.: 886,719

[22] Filed: Jul. 18, 1986

[30] Foreign Application Priority Data

Jul. 18, 1985 [JP] Japan ................................. 159720

[51] Int. Cl.$^4$ ............................................. H03G 3/10
[52] U.S. Cl. ..................................... 330/282; 330/279
[58] Field of Search ................. 330/278, 279, 282, 285

[56] References Cited

U.S. PATENT DOCUMENTS 4,155,048  5/1979  Kabayama ........................... 330/282

Primary Examiner—Gene Wan
Attorney, Agent, or Firm—Sughrue, Mion, Zinn, Macpeak & Seas

[57] ABSTRACT

An amplification gain adjusting circuit in which the gain of an AC amplifier is controlled by a voltage dividing series connection of two resistors. One of the resistors is selectively shorted by a switching transistor. The DC bias of the switching transistor is set to prevent current flow through the base of the switching transistor at high AC levels.

11 Claims, 4 Drawing Sheets

AMPLIFICATION GAIN ADJUSTING CIRCUIT

BACKGROUND OF THE INVENTION

1. Field of the Invention

The present invention relates generally to an amplification gain adjusting circuit and particularly relates to an amplification gain adjusting circuit which adjusts the gain of an amplifier driven by a signal power supply by changing a voltage dividing ratio of a resistance type voltage divider by a switching operation of a transistor.

2. Background Art

FIG. 7 shows a known amplification gain adjusting circuit of the kind as described above which is illustrated by way of example. As illustrated, the circuit is applied to an amplifier used in mobile audio equipment. In the drawing, an audio signal input terminal 1 is connected to a non-inverted input terminal of an operational amplifier 2. Generally, when the amplification gain adjusting circuit is used for the amplifier in mobile audio equipment, a bias voltage (+B/2) which is one-half of a supply voltage (+B) is produced by a bias voltage producing circuit 3 and supplied to the non-inverting input terminal of the operational amplifier 2 through a resistor $R_1$. This extra input is used because the amplifier is generally operated by a single power supply (a battery) and the AC output of the amplifier 2 oscillates around the DC bias of +B/2. An output terminal of the operational amplifier 2 is connected to a signal output terminal 4 as well as to an inverted input terminal of the operational amplifier 2 through a resistor $R_2$.

A bias cut-off capacitor $C_1$ and resistors $R_3$ and $R_4$ are connected in series between the inverted input terminal of the operational amplifier 2 and ground (zero potential), and a switching transistor $Q_1$ is connected in parallel to the resistor $R_4$. The supply voltage (+B) is selectively applied to the base of the transistor $Q_1$ through a switch S for controlling the turn-on and turn-off of the transistor $Q_1$. This switched supply voltage (+B) is supplied through a resistor $R_5$ to the base of the transistor $Q_1$ for controlling the base current of the transistor $Q_1$. A resistor $R_6$ and a capacitor $C_2$ are connected in parallel between the base of the transistor $Q_1$ and ground, and this parallel RC circuit provides a time constant to fluctuations in the DC voltage of the battery at the signal output terminal 4 when the transistor $Q_1$ is turned on or off, so as to reduce noise. The resistor $R_6$ also acts to maintain the base potential of the transistor $Q_1$ at the ground level to thereby prevent a misoperation of the transistor $Q_1$ from occurring when the switch S is in the opened state.

Next, description will be made as to the operation of the thus arranged amplification degree adjusting circuit.

Assume that an AC input signal ($E_i = Ae^{j\omega t}$) is applied to the non-inverted input terminal of the operational amplifier 2 through the signal input terminal 1. When the switch S is in the opened state, an AC output signal $E_{00}$ (in addition to the DC bias of +B/2) derived at the signal output terminal 4 is expressed by the following equation because the transistor $Q_1$ is in the off-state.

$$E_{00} = E_i \cdot \frac{R_2 + R_3 + R_4}{R_3 + R_4} = A \cdot \frac{R_2 + R_3 + R_4}{R_3 + R_4} e^{j\omega t}$$

When the switch S is in the closed state, on the other hand, an output signal $E_{0S}$ generated at the signal output terminal 4 is expressed by the following equation because the transistor $Q_1$ is in the on-state so that the resistor $R_4$ is shorted.

$$E_{0S} = E_i \cdot \frac{R_2 + R_3}{R_3} = A \cdot \frac{R_2 + R_3}{R_3} e^{j\omega t}$$

Therefore, a ratio ($E_{0S}/E_{00}$) is as follows:

$$E_{0S}/E_{00} = 1 + \frac{R_2 \cdot R_4}{R_3 \cdot (R_2 + R_3 + R_4)}.$$

In the thus arranged conventional amplification gain adjusting circuit, the DC collector potential of the switching transistor $Q_1$ is set to ground. Therefore when an instantaneous base-collector forward voltage ($V_F$) is applied across the collector and base of the transistor $Q_1$ in the opened stage of the switch S, current begins to flow through the base. That is, when the AC component at the collector of the transistor $Q_1$ is less than $-V_F$, a current may flow from ground into the collector through the base-collector path of the transistor $Q_1$ and the parallel circuit of the resistor $R_6$ and the capacitor $C_2$. The result is equivalent to a reduction in the resistance value $R_{CE}$ of the collector-emitter path of the transistor $Q_1$ in its off-stage, so that the output waveform appearing at the signal output terminal 4 becomes vertically asymmetrical as shown in FIG. 9.

In order to eliminate the foregoing disadvantages, there has been proposed an amplification gain adjusting circuit as shown in FIG. 10, which is provided with a buffer circuit of a transistor $Q_2$, resistors $R_6$ and $R_7$, and a capacitor $C_2$. In the thus arranged amplification gain adjusting circuit, however, there arises another disadvantage in the increase in the number of parts as well as generation of pop noises upon turning a switch S off because a time constant cannot be provided at that time.

SUMMARY OF THE INVENTION

An object of the present invention is therefore to eliminate the foregoing disadvantages in the prior art.

Another object of the present invention is to provide an amplification degree adjusting circuit in which it is possible to improve distortion in waveform of an amplifier output without increasing the number of parts.

In order to attain the foregoing objects, according to the present invention, the amplification gain adjusting circuit adjusts an amplification factor of an amplifier driven by a single power supply by changing a voltage dividing ratio of a resistance type voltage divider. This changing is performed by a switching operation of a transistor. According to the invention, a DC collector potential of the transistor is set to be substantially equal to a DC potential at an output terminal of the amplifier.

Preferably also, an emitter potential of the switching transistor is set to be substantially equal to the DC potential at the output terminal of the amplifier.

Preferably, a bias potential of the transistor in its off-state is set to a value sufficiently lower than the collector potential.

The above objects, features, and advantages of the present invention will be apparent from the following detailed description taken in conjunction with the accompanying drawings.

DETAILED DESCRIPTION OF THE PREFERRED EMBODIMENTS

Figure 1:
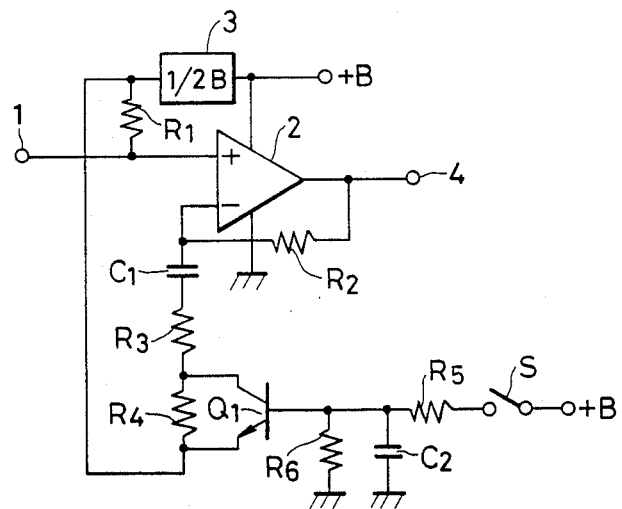
FIG. 1 is a circuit diagram showing an embodiment according to the present invention, applied to an amplifier circuit using an operational amplifier.

Referring to the drawings, embodiments of the amplification gain adjusting circuit according to the present invention will be described in detail hereunder.

FIG. 1 is a circuit diagram showing an embodiment according to the present invention. In the drawing, a capacitor $C_1$ and resistors $R_3$ and $R_4$ are connected in series between an inverted input terminal of an operational amplifier 2 and an output terminal of a bias voltage producing circuit 3. The emitter of a transistor $Q_1$ is connected to the output terminal of the bias voltage producing circuit 3, which is at a potential of $+B/2$. Except for the connection of the emitter of the transistor Q to $+B/2$ as described above, the circuit of FIG. 1 is quite the same as FIG. 7.

The junction between the resistor $R_4$ and the emitter of the transistor $Q_1$ is connected to the output terminal of the bias voltage producing circuit 2 such that the DC potential at the junction is established to be $+B/2$ (volts), so that the DC collector potential of the transistor $Q_1$ becomes $+B/2$ (volts).

Therefore, when a switch S is in the opened state so as to maintain the transistor $Q_1$ in its off-state, the signal amplitude level (Ap-p/2) at the collector of the transistor $Q_1$ allows a current to begin to flow from ground (zero level) to the collector through the base-collector path and a parallel circuit of a resistor $R_6$ and a capacitor $C_2$ when the AC voltage at the collector is less than $-(+B/2+V_F)$. This voltage $-(+B/2+V_F)$ at which the base begins to conduct is equal to or more than one half the peak-to-peak value of the maximum output level (chip point) of the ordinary operational amplifier 2. Thus, it becomes possible to reproduce an input signal with no distortion from a low output level to the maximum one of the operational amplifier 2.

Figure 7:
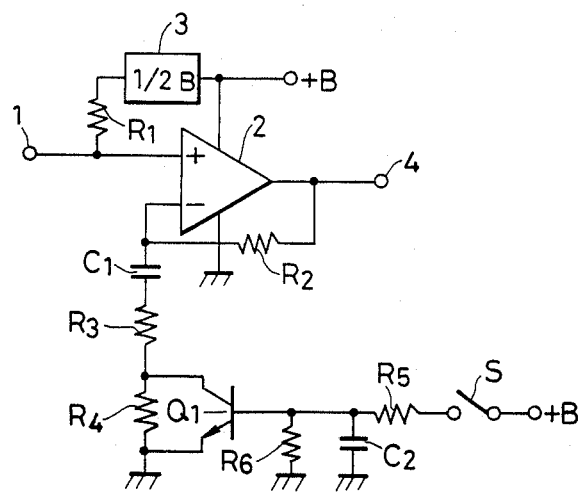
FIG. 7 is a circuit diagram showing a further example of the prior art applied to an amplifier circuit using an operational amplifier.
Figure 8:
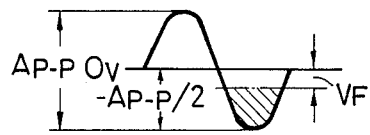
FIG. 8 shows waveforms for explaining the operation of the circuit of FIG. 7.
Figure 10:
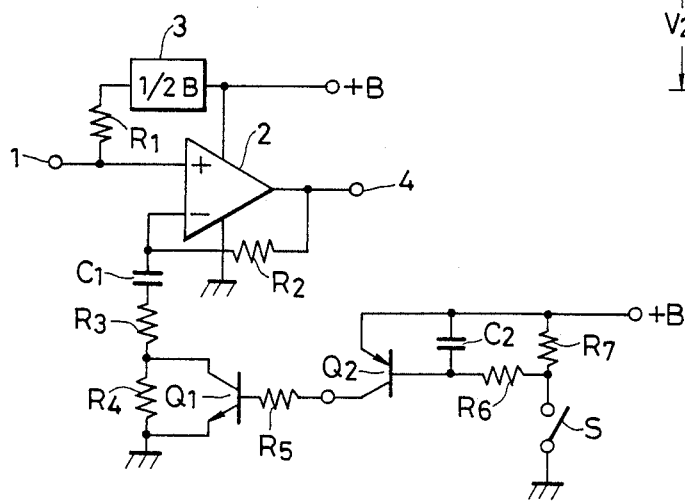
FIG. 10 is a circuit diagram showing a still further example of the prior art applied to an amplifier circuit using an operational amplifier.
Figure 9:
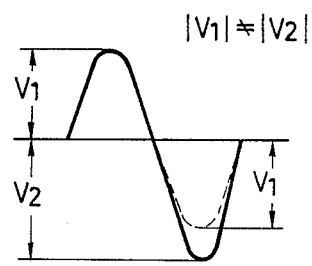
FIG. 9 shows a waveform of the output of the circuit of FIG. 7.

When the switch S is closed so as to turn the transistor $Q_1$ on, on the other hand, the same circuit operation as that of FIG. 7 is carried out. The DC emitter potential of the transistor $Q_1$ is $+B/2$ (volts) at that time and an RC time constant circuit is provided between the base of the transistor $Q_1$ and ground similarly to the conventional circuit. It is thus possible to give a time constant to a fluctuation in a DC voltage at a signal output terminal 4 when the transistor $Q_1$ is turned on or off, so that pop noises can be prevented from occurring.

Figure 2:
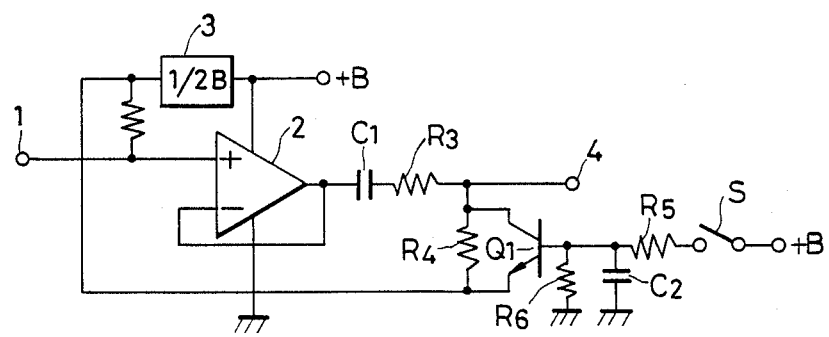
FIG. 2 is a circuit diagram showing another embodiment according to the present invention, applied to an amplifier circuit using an operational amplifier.

The previous description has been made as to the amplification gain adjusting circuit for adjusting the output level of the operational amplifier 2 by the adjustment of the level at the inverted input terminal of the operational amplifier 2 in the foregoing embodiment. Additionally, the present invention can be applied to a muting circuit (a kind of amplification gain adjusting circuit). As shown in FIG. 2, the muting circuit mutes an output level of an operational amplifier 2 by selectively grounding a signal output terminal 4 by a switching operation of a transistor $Q_1$ to obtain the same effects as the foregoing embodiment. In FIG. 2, a junction between a resistor $R_4$ and the emitter of the transistor $Q_1$ is connected to an output terminal of a bias voltage producing circuit 3 so that a DC collector potential of the transistor $Q_1$ at an output terminal of the operational amplifier 2 can be selectively made equal to a DC potential. Thus, without increasing the number of parts, it is possible to eliminate such a foregoing disadvantage in the prior art that a signal waveform becomes vertically asymmetrical when a signal of one-half of the peak-to-peak value of the output level of the operational amplifier 2 exceeds a base collector forward voltage ($V_F$) of the muting transistor $Q_1$ and is applied to the collector of the transistor $Q_1$ in the off-state of the muting.

Figure 3:
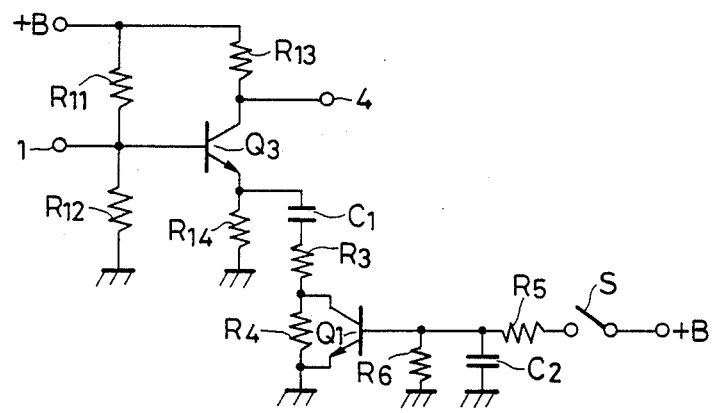
FIG. 3 is a circuit diagram showing an example of the prior art applied to a transistor amplifier.

Further, although description has been made as to the case where the invention is applied to an amplifier circuit using an operational amplifier in the foregoing embodiments, it is possible to apply the invention to an ordinary amplifier circuit using a transistor. FIG. 3 shows an example of the prior art in which a conventional amplification gain adjusting circuit is applied to the transistor amplifier. In the drawing, a signal input terminal 1 is connected to the base of a signal transistor $Q_3$ constituting the amplifier. A bias voltage is applied to the base of the signal transistor $Q_3$ through resistor $R_{11}$ and $R_{12}$ connected in series between a power supply $+B$ and the ground to thereby constitute a voltage divider. The emitter of the signal transistor $Q_3$ is grounded through a resistor $R_{14}$, while the collector thereof is connected to the power supply $+B$ through a resistor $R_{13}$ and is directly connected to a signal output terminal 4. A bias cut-off capacitor $C_1$ and resistors $R_3$ and $R_4$ are connected in series between the emitter of the signal transistor $Q_3$ and ground. The resistor $R_4$ is connected in parallel to a switching transistor $Q_1$, the circuit arrangement of which is quite the same as that of FIG. 1.

In the thus arranged conventional amplification gain adjusting circuit, the fundamental operation is such that the impedance at the emitter of the transistor $Q_3$ is adjusted to thereby adjust the level at its collector. However, there has been the same disadvantage as that in the foregoing conventional case where an operational amplifier is used. That is, when a signal having an amplitude (Ap-p/2 > $V_F$) exceeding the base-collector forward voltage ($V_F$) is applied to the collector of the transistor $Q_1$ when a switch S is in the opened state, a current flows from ground through the base-collector path of the switching transistor $Q_1$ and the parallel circuit of a resistor $R_6$ and a capacitor $C_2$, so that the waveform of an output derived at the collector of the transistor $Q_3$ becomes vertically asymmetrical.

Figure 4:
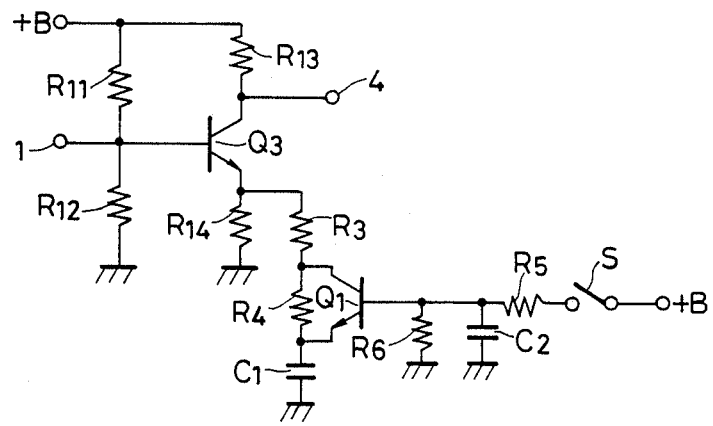
FIG. 4 is a circuit diagram showing a further embodiment according to the present invention, applied to a transistor amplifier circuit.

Therefore, in a further embodiment according to the present invention shown in FIG. 4, a DC cut-off capacitor $C_1$ is provided between the ground and a junction between a resistor $R_4$ and the emitter of a transistor $Q_1$ to thereby make the DC emitter potential of the signal $Q_3$ equal to the collector potential of the switching transistor $Q_1$.

As a result, when a switch S is in the opened state, the emitter potential ($V_E$) of the transistor $Q_3$ is expressed by $$V_E = +B \cdot \frac{R_{12}}{R_{11} + R_{12}} - V_{BE}.$$

so that the collector potential of the transistor $Q_1$ is established to be higher than a base potential of the same. Accordingly, the signal amplitude level (Ap-p/2) at the collector of the switching transistor $Q_1$ allows a current to begin to flow from ground to the collector through the base-collector path of the transistor $Q_1$ and a parallel circuit of a resistor $R_6$ and a capacitor $C_2$ and only when the signal amplitude level (Ap-p/2) is less than $$-\left( +B \cdot \frac{R_{12}}{R_{11} + R_{12}} - V_{BE} + V_F \right).$$

This voltage at which the base begins to conduct is equal to or more than one half of the peak-to-peak value of the maximum output level (clip point) of the ordinary transistor amplifier, so that it becomes possible to amplify the signal with no distortion.

When the switch S is closed to turn the signal transistor $Q_1$ on, a controlling current for the switching transistor $Q_3$ flows through resistors $R_3$ and $R_{14}$ to make it possible to adjust the emitter end impedance of the transistor $Q_3$ in the same manner as in the conventional example.

Figure 5:
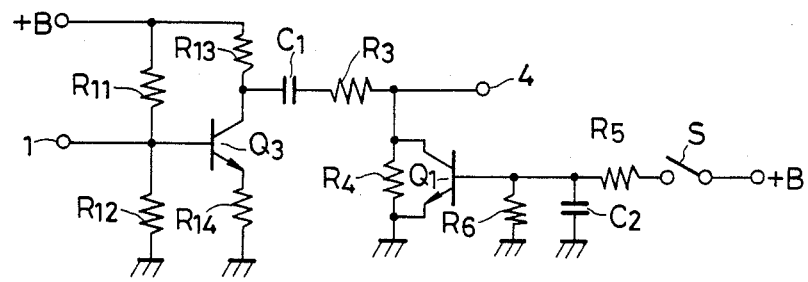
FIG. 5 is a circuit diagram showing another example of the prior art applied to a transistor amplifier circuit.
Figure 6:
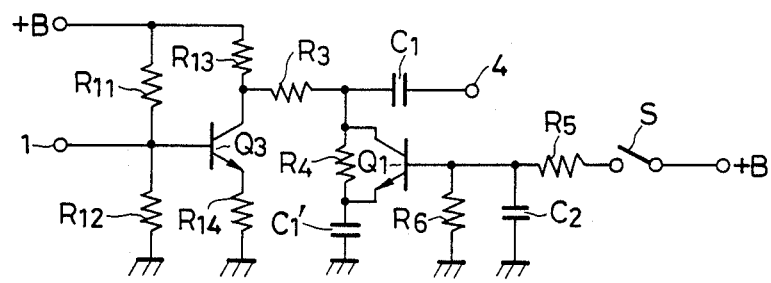
FIG. 6 is a circuit diagram showing a still further embodiment according to the present invention applied to a transistor amplifier circuit.

FIG. 5 shows another example of the prior art muting circuit applied to a transistor amplifier, in which a resistor $R_4$ is shorted by a switching operation of a switching transistor $Q_1$ to thereby mute an output level of a muting transistor $Q_3$. In this arrangement, similarly to the foregoing conventional examples, there has been such a disadvantage that when a signal which is one-half of the peak-to-peak value of the output level of the transistor $Q_3$ exceeds a base-collector forward voltage ($V_F$) of the muting transistor $Q_1$ and is applied to the collector of the switching transistor $Q_1$ in the off-stage of the muting circuit, the waveform of the output signal becomes vertically asymmetrical. In order to eliminate this disadvantage, in a still further embodiment according to the present invention shown in FIG. 6, a DC cut-off capacitor $C_1'$ is provided between ground and a junction between a resistor $R_4$ and the emitter of the muting transistor $Q_1$ to thereby establish the DC emitter potential of the muting transistor $Q_3$ to be equal to a DC collector potential of the switching transistor $Q_1$. Thereby the same beneficial effects as the foregoing embodiments are obtained.

In the embodiments of FIGS. 1 and 2, the DC cut-off capacitor $C_1$ may be omitted if it is unnecessary to perform low band cut-off by use of the capacitor $C_1$.

As described above, according to the present invention, the DC collector potential of the switching transistor is set to be substantially equal to the DC potential at the output terminal of the amplifier, so that it is possible to produce an output signal having a nondistorted waveform over a wide range of low output level to the maximum one (clip point) of the amplifier without increasing the number of parts used.

What is claimed is:

1. An amplification gain adjusting circuit comprising:
   a single power supply;
   an amplifier powered by said single power supply;
   a resistance type voltage divider connected to said amplifier for controlling a gain factor of said amplifier;
   a switching transistor for changing a voltage dividing ratio of said voltage divider to thereby change said gain factor; and
   means for maintaining a DC potential at a collector of said transistor to be substantially equal to a DC potential at an output of said amplifier.

2. An amplification gain adjusting circuit as recited in claim 1, further comprising means for setting said DC potential at an output of said amplifier at a midpoint potential of said single power supply.

3. An amplification gain adjusting circuit as recited is claim 1, wherein said maintaining means further maintains a DC potential at an emitter of said switching transistor to be substantially equal to said DC potential 4. An amplification gain adjusting circuit as recited in claim 1, wherein said maintaining means supplies a DC potential derived from said single power supply to a terminal of said switching transistor.

5. An amplification gain adjusting circuit as recited in claim 1, wherein said maintaining means comprises a capacitor connected between a terminal of said switching transistor and a fixed potential.

6. An amplification gain adjusting circuit as recited in claim 1, further comprising:
   time constant means coupled between a base of said switching transistor and a fixed potential; and
   switching means coupled to a fixed potential for controlling a base of said switching transistor.

7. An amplification gain adjusting circuit, comprising:
   a single voltage supply;
   voltage reduction means coupled to said voltage supply for providing on an output a fixed fraction of a voltage of said voltage supply;
   an operational amplifier powered by said voltage supply and connected to a non-inverting input to an input signal and through a resistor to said output of said voltage reduction means, an output of said operational amplifier being coupled to an inverting input of said operational amplifier;
   a first and a second resistor connected in series and coupled between said inverting input and said output of said voltage reduction means;
   a switching transistor having two principal current electrodes connected in parallel across said second resistor;
   a capacitor and a resistor connected in parallel between a control electrode of said switching transistor and a fixed potential; and
   a switch and a resistor connected in series between said voltage supply and said control electrode of said switching transistor.

8. An amplification gain adjusting circuit as recited in claim 7, further comprising a feedback resistor coupled between said output and said inverting input of said operational amplifier and wherein said first and second resistors are coupled to a junction point of said feedback resistor and said inverting input and said output of said operational amplifier is an output of said circuit.

9. An amplification gain adjusting circuit as recited in claim 7, wherein said output and said inverting input of said operational amplifier are at a same potential and a junction point of said first and second resistors is an output of said circuit.

10. An amplification gain adjusting circuit, comprising:
a signal transistor having a first principal current electrode connected through a first resistor to a first fixed voltage, a second principal current electrode connected through a second resistor to a second fixed potential and a control electrode connected to an input terminal, connected through a third resistor to said first fixed voltage and connected through a fourth resistor to said second fixed potential;
a fifth resistor, a sixth resistor and a capacitor connected in the stated order in series between said first current electrode and said second fixed potential;
a switching transistor having two principal current electrodes connected in parallel across and sixth transistor;
a capacitor and a resistor connected in parallel between a control electrode of said switching transistor and said second fixed potential; and
a resistor and a switch connected in series between said control electrode of said switching transistor and said first fixed potential.

11. An amplification gain adjusting circuit as recited in claim 1, wherein said maintaining means maintains said DC potential at said collector of said switching transistor at a value higher than a value which permits current flow through a base of said switching transistor.

* * * * *